(12) United States Patent
Hoang et al.

(10) Patent No.: US 6,744,131 B1
(45) Date of Patent: Jun. 1, 2004

(54) FLIP CHIP INTEGRATED CIRCUIT PACKAGES ACCOMMODATING EXPOSED CHIP CAPACITORS WHILE PROVIDING STRUCTURAL RIGIDITY

(75) Inventors: Lan Hoang Hoang, Fremont, CA (US); Hoa Lap Do, Herald, CA (US); Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/421,486

(22) Filed: Apr. 22, 2003

(51) Int. Cl.[7] .................... H01L 23/12; H01L 23/34
(52) U.S. Cl. ................. 257/704; 257/778; 257/723; 257/724; 257/786; 257/693; 257/678
(58) Field of Search ................... 257/704, 778, 257/786, 678, 693

(56) References Cited

U.S. PATENT DOCUMENTS

| | | | | |
|---|---|---|---|---|
| 4,598,307 A | | 7/1986 | Wakabayashi et al. | |
| 5,712,768 A | * | 1/1998 | Werther | 361/767 |
| 5,909,055 A | * | 6/1999 | Yamashita et al. | 257/693 |
| 6,057,596 A | * | 5/2000 | Lin et al. | 257/697 |
| 6,160,715 A | * | 12/2000 | Degani et al. | 361/767 |
| 6,274,929 B1 | * | 8/2001 | Leong et al. | 257/724 |
| 6,335,566 B1 | * | 1/2002 | Hirashima et al. | 257/686 |
| 6,380,002 B2 | * | 4/2002 | Hsu et al. | 438/118 |
| 6,403,896 B1 | * | 6/2002 | Ma et al. | 174/261 |
| 6,448,639 B1 | * | 9/2002 | Ma | 257/691 |
| 6,476,465 B2 | * | 11/2002 | Hirose | 257/666 |
| 6,476,486 B1 | * | 11/2002 | Humphrey et al. | 257/738 |
| 6,515,362 B2 | * | 2/2003 | Chang | 257/750 |
| 6,566,166 B2 | * | 5/2003 | Chien | 438/108 |
| 6,605,492 B2 | * | 8/2003 | Barrett | 438/126 |
| 2002/0008314 A1 | * | 1/2002 | Takeuchi | 257/697 |

* cited by examiner

*Primary Examiner*—Jasmine Clark
(74) *Attorney, Agent, or Firm*—Lois D. Cartier

(57) ABSTRACT

An IC package provides structural rigidity to a flexible substrate, but still allows access to mounted capacitors after package assembly. In a flip chip package, the IC die is mounted face down on a flexible laminate substrate. A metal lid is mounted above and in contact with the die. The metal lid includes openings over portions of an outer region of the substrate to accommodate the capacitors. However, portions of the metal lid extend to the corners of the substrate to provide structural rigidity to the flexible substrate. Some embodiments are directed to packages configured as described above, but in which an IC die has yet to be mounted.

42 Claims, 5 Drawing Sheets

FLIP CHIP INTEGRATED CIRCUIT PACKAGES ACCOMMODATING EXPOSED CHIP CAPACITORS WHILE PROVIDING STRUCTURAL RIGIDITY

FIELD OF THE INVENTION

The invention relates to packages for integrated circuits (ICs). More particularly, the invention relates to an IC package that includes a lid specialized for including external capacitors within the package, while providing the structural rigidity that is needed when flexible substrates are used.

BACKGROUND OF THE INVENTION

IC packages are available in many different forms and configurations. One popular configuration is the "flip chip" configuration, in which the IC die is mounted face-down in the package (i.e., with the active surface of the die towards the package pins). Thus, the pads on the active surface of the IC (e.g., power pads, ground pads, and/or input/output or I/O pads) can be brought into contact (e.g., through "solder bumps") with lands disposed across the surface of the substrate. The lands are in turn coupled through vias (i.e., holes through the substrate filled with a conductive material) to package pins (e.g., balls or pins) on the bottom surface of the package.

Some IC packages include provision for capacitors mounted inside the package. Providing capacitors within the package has some strong advantages over the alternative approaches of including capacitors on the surface of the die, or mounting capacitors outside the package. Including capacitors on the surface of the die increases the surface area, and thus the cost, of the die. Further, changing the size of a capacitor included on the die requires making new masks and manufacturing new die, while capacitors implemented as separate units from the die are easily modified. On the other hand, mounting capacitors outside the package introduces noise into the circuits in the die and consumes valuable area on the PC board.

ICs are becoming more sensitive to noise as the typical operating voltages drop to levels closer to the threshold voltages of the IC transistors on the die. Therefore, it is desirable to reduce noise as much as possible. Further, the number of pads per area of die is also increasing, so today's ICs typically have a higher switching current than in the past. Hence, the capability of mounting capacitors within an IC package is becoming more and more desirable.

FIG. 1 shows a well known type of flip chip package that includes capacitors within the package. On a laminate substrate 101 are mounted the die 102 and the desired number of capacitors 104, 105. The exemplary package in FIG. 1 includes two different types of capacitors (104 and 105), but any number of different types of capacitors can be included. The terminals of the capacitors are coupled to connection points (e.g., ground pads, power pads, and/or I/O pads, not shown) of the die 102 through metal traces (not shown) layered in the laminate substrate 101. The terminals of the capacitors can also be coupled through the metal traces to the package pins on the bottom surface of the package. Over the surface of this structure is laid a metal lid 103, which is typically in direct contact with the backside of the die 102 (the upper surface as shown in FIG. 1). If any of capacitors 104, 105 protrudes above the backside of the die 102, a rectangular portion of the inside surface of the lid 103 is manufactured to protrude from the inner surface of the lid, to maintain contact with the backside of the die.

One type of IC package that was once commonly used is the ceramic dual in-line (CERDIP) package, in which the IC die is mounted with the active surface away from the package pins. In CERDIP packages, the ceramic substrate and ceramic lid are made relatively thick to provide structural strength. A flip chip package is generally thinner than a ceramic package, partially because a laminate substrate is used rather than a ceramic substrate, and partially because a metal lid is used rather than a ceramic lid. The metal lid also has another advantage when used with a laminate substrate; it provides the structural rigidity that the flexible laminate substrate lacks. Without this structural rigidity, applying mechanical or thermal stress to the package could cause damage to the connections between the substrate and the board to which it is mounted, or between the pads of the die and the lands in the substrate. Also, the metal lid prevents the laminate substrate from warping under heat, e.g., when the package is being mounted to the board. This warping could cause disconnects or poor connections between the substrate and the board.

FIG. 2 illustrates a laminate substrate that can be used, for example, with the IC package structure shown in FIG. 1. Laminate substrate 201 includes an inner region 206 (indicated by a dotted line) and an outer region 207. The inner region 206 includes lands 208, and the outer region 207 includes lands 209. Inner lands 208 come into contact with pads on the IC die (e.g., die 102 in FIG. 1), while outer lands 209 are coupled to terminals of the capacitors (e.g., capacitors 104 and 105 of FIG. 1). Traces 210 interconnect the inner lands with the outer lands. The traces are typically copper traces sandwiched within the laminate substrate. Only two traces are shown in FIG. 2, for clarity, but many more traces are typically present. When the die (not shown) is in place, the traces electrically couple the capacitors (not shown) to one or more desired pads of the die.

There are drawbacks to the IC package structure shown in FIG. 1. For example, it is not possible to visually inspect capacitors after the lid has been applied. In fact, it can be difficult or impossible even to test the capacitors, as they are not readily accessible to test probes after the lid has been applied. Further, the capacitors cannot be reworked without removing the lid, which process can damage or detach the die and otherwise undamaged capacitors.

FIG. 3 shows another known IC package that addresses these drawbacks by eliminating the lid altogether. FIG. 3 illustrates substrate 301, die 302, and capacitors 304, 305. However, no lid is shown or provided. When the package of FIG. 3 is used, the capacitors can be mounted in the package, yet remain available for visual inspection, testing, and replacement, if necessary. However, clearly the die is left exposed. A lid provides mechanical protection for the die that is often desirable and even necessary in many applications. The lid also provides mechanical protection for the capacitors, e.g., during the testing sequence of the packaged device. Further, as previously described, the lid also provides structural rigidity (i.e., acts as a "stiffener") for the package. Removing the lid can make the package significantly more susceptible to warping, which can affect the second level board assembly and reliability.

Therefore, it is desirable to provide an IC package that can include capacitors within the package, make the capacitors accessible after the lid is applied, and still supply all the necessary structural rigidity required by the use of a flexible substrate.

SUMMARY OF THE INVENTION

The invention provides an IC package that provides structural rigidity to a flexible substrate, but still allows access to mounted capacitors after package assembly. In a flip chip package, the IC die is mounted face down on a flexible laminate substrate. A metal lid is mounted above and in contact with the die. The metal lid includes openings over portions of an outer region of the substrate to accommodate the capacitors. However, portions of the metal lid extend to the corners of the substrate to provide structural rigidity to the flexible substrate. Some embodiments are directed to packages configured as described above, but in which an IC die has yet to be mounted.

According to a first embodiment, a packaged IC includes a flexible substrate, an IC die, and a structurally rigid lid. The flexible substrate includes an inner region, an outer region, inner lands disposed in the inner region, outer lands disposed in the outer region, and a plurality of traces each coupled between an inner land and an outer land. The IC die has an active surface and an upper surface, and is mounted in the inner region of the flexible substrate with the active surface facing the flexible substrate. Pads of the IC die are in electrical contact with the inner lands of the substrate. The structurally rigid lid is disposed in contact with the upper surface of the IC die and sealed to the flexible substrate. The structurally rigid lid also has openings that expose only a portion of the outer region of the flexible substrate.

In some embodiments, the packaged IC also includes capacitors mounted to the flexible substrate within the openings in the structurally rigid lid. Terminals of each capacitor are in electrical contact with a plurality of the outer lands. In some embodiments, the structurally rigid lid is a metal lid. In some embodiments, the flexible substrate is a laminate substrate. In some embodiments, the structurally rigid lid is sealed to the flexible substrate using a non-hermetic seal.

In some embodiments, the outer region of the flexible substrate has outer corners at a plurality of points furthest from a center point of the flexible substrate. The structurally rigid lid has outer corners corresponding to the outer corners of the outer region of the flexible substrate. In some of these embodiments, the outer corners of the two elements are sealed together, with either a hermetic seal or a non-hermetic seal.

According to another embodiment, a packaged IC includes a laminate substrate, an IC die, and a metal lid. The laminate substrate includes an inner region and an outer region. The IC die has an active surface and an upper surface, and is mounted in the inner region of the laminate substrate with the active surface facing the laminate substrate. The metal lid includes openings that expose only a portion of the outer region of the laminate substrate. Some embodiments also include a plurality of capacitors mounted to the laminate substrate within the openings in the metal lid.

In some embodiments, the outer region of the laminate substrate includes outer corners at the points furthest from a center point of the laminate substrate. The metal lid has outer corners that correspond to the outer corners of the laminate substrate and are sealed thereto. Thus, the metal lid adds structural rigidity to the laminate substrate.

According to another embodiment, a packaged IC includes a flexible rectangular substrate, an IC die, and a structurally rigid lid. The flexible rectangular substrate includes four edges, four corners located between adjacent ones of the edges, an outer region touching each of the four corners, and a rectangular inner region encompassed by the outer region. The IC die has an active surface and an upper surface, and is mounted in the inner region of the substrate with the active surface facing the substrate. The structurally rigid lid is disposed in contact with the upper surface of the IC die. The lid has four corners corresponding to the four corners of the substrate, and also has openings that expose only a portion of the outer region of the substrate. The exposed portion does not include any of the four corners of the substrate. The four corners of the structurally rigid lid are sealed to the four corners of the substrate. Therefore, the lid provides structural rigidity to the four corners of the substrate. Some embodiments also include a plurality of capacitors mounted to the flexible rectangular substrate within the openings in the structurally rigid lid.

Other aspects of the invention are directed to packages for accommodating both capacitors and an integrated circuit (IC) die. According to one embodiment, a package comprises a flexible substrate and a structurally rigid lid. The flexible substrate includes an inner region, an outer region, inner lands disposed in the inner region and adapted for coupling to the IC die, outer lands disposed in the outer region and adapted for coupling to the capacitors, and a plurality of traces each coupled between an inner land and an outer land. The structurally rigid lid is configured to be disposed in contact with the upper surface of the IC die after mounting the IC die in the package. The structurally rigid lid has openings that expose only a portion of the outer region of the flexible substrate.

Some embodiments also include an IC die. The IC die has an active surface and an upper surface, and is mounted in the inner region of the flexible substrate with the active surface facing the flexible substrate. The IC die has pads in electrical contact with the inner lands of the flexible substrate.

Some embodiments also include a plurality of capacitors. The capacitors are mounted to the flexible substrate within the openings in the structurally rigid lid. Each capacitor has a plurality of terminals in electrical contact with a plurality of the outer lands.

According to another embodiment, a package includes a flexible rectangular substrate and a structurally rigid lid. The flexible rectangular substrate includes four edges, four corners located between adjacent ones of the edges, an outer region touching each of the four corners, and a rectangular inner region encompassed by the outer region. The inner region includes a plurality of inner lands adapted for coupling to the IC die. The outer region includes a plurality of outer lands adapted for coupling to the capacitors. The structurally rigid lid is configured to be disposed in contact with the upper surface of the IC die after mounting the IC die in the package. The lid has four corners corresponding to the four corners of the substrate. The lid also includes openings that expose only a portion of the outer region of the substrate. The exposed portion does not include any of the four corners of the substrate. The four corners of the structurally rigid lid are configured to be sealed to the four corners of the substrate. Thus, the lid provides structural rigidity to the four corners of the substrate.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 4:
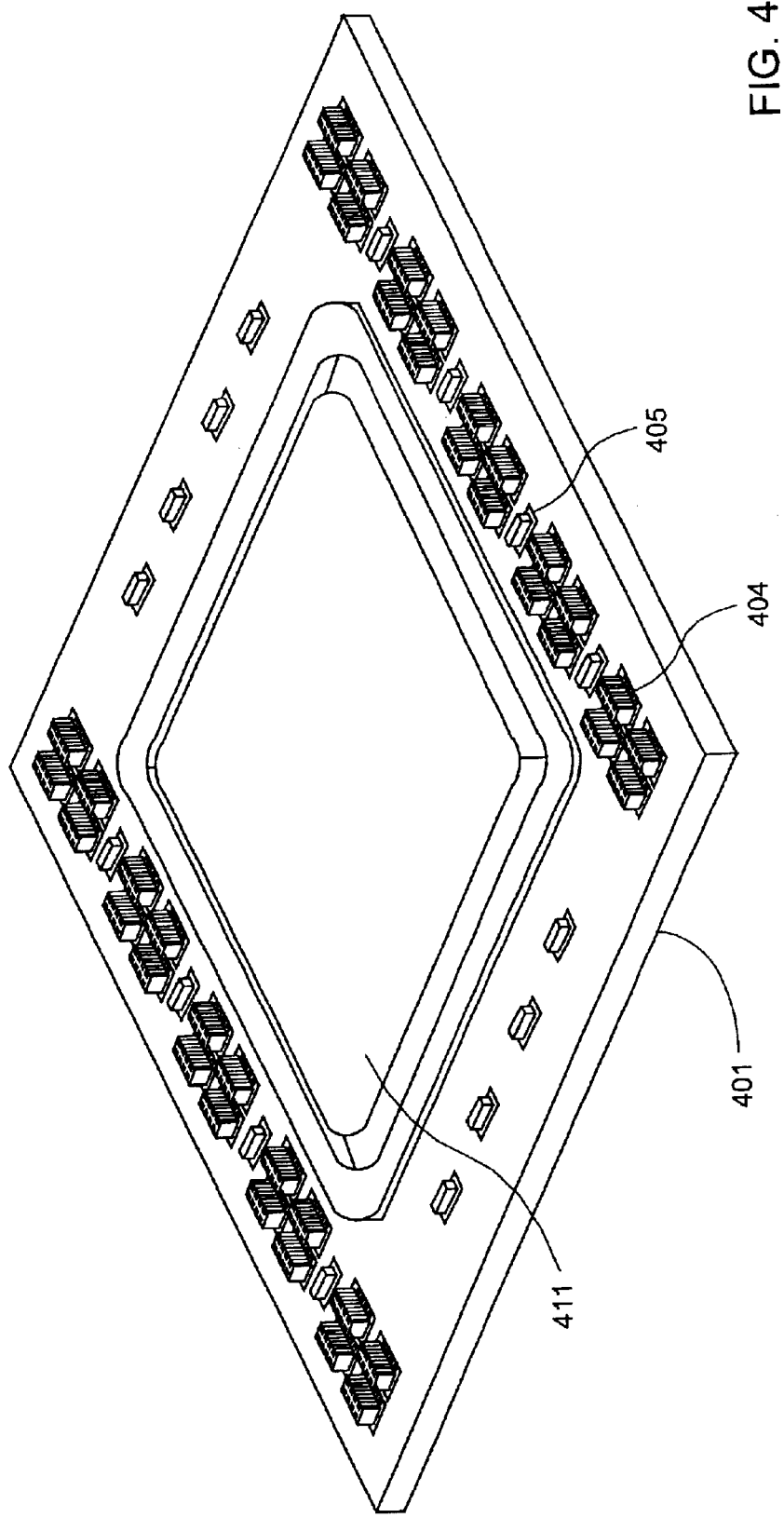
FIG. 4 shows an IC package in which a rectangular lid is used that covers the die but leaves the capacitors exposed.

FIG. 4 shows one possible solution to some of the challenges described in the Background section, above. In the IC package shown in FIG. 4, a structurally rigid lid 411 is applied over the die (not shown), covering approximately the inner region (see area 206 of FIG. 2) of the flexible substrate 401. However, the outer region of the substrate is not covered by a lid.

Figure 1:
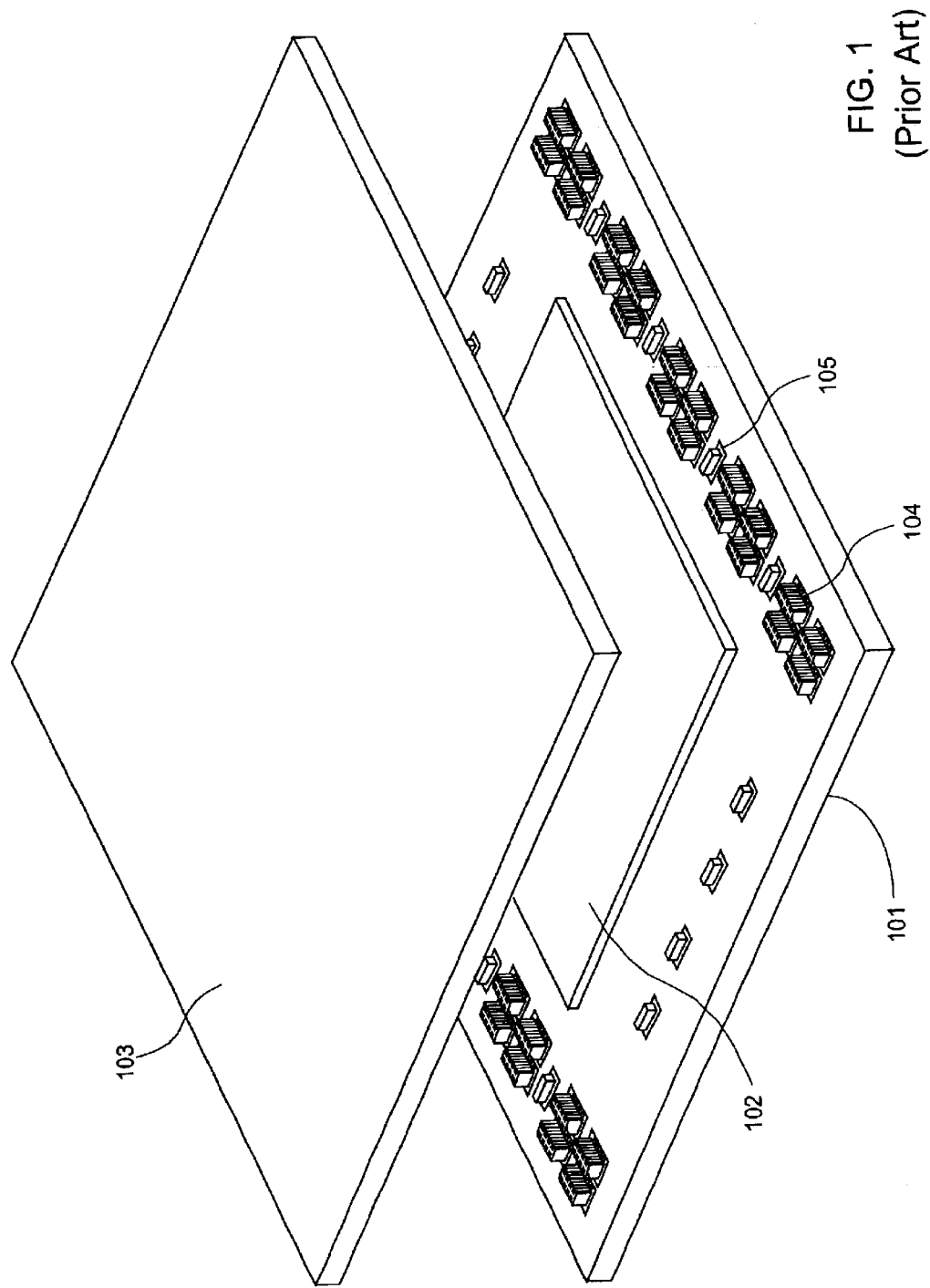
FIG. 1 shows a prior art IC package in which a lid covers the die and capacitors.
Figure 2:
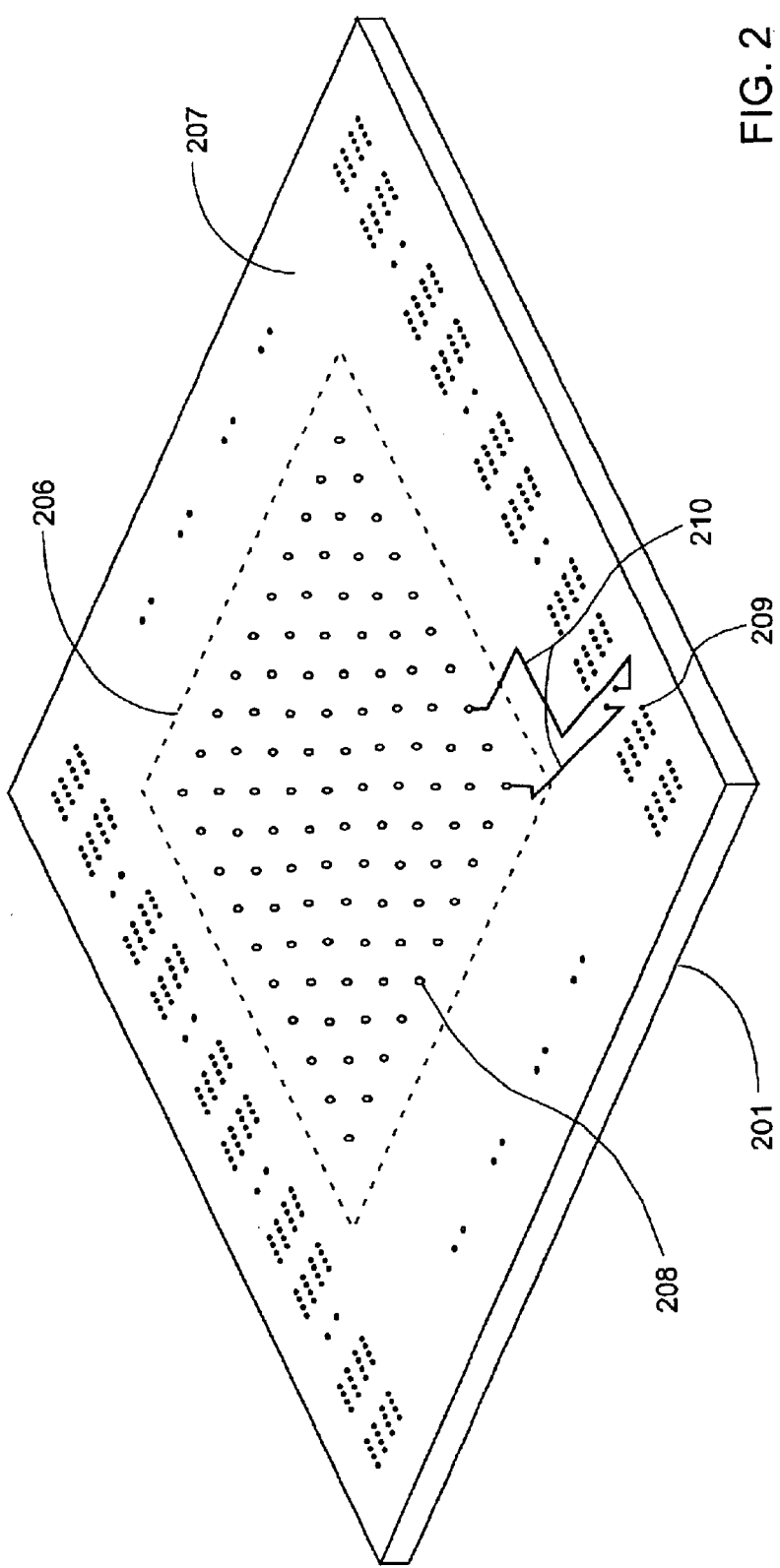
FIG. 2 shows a laminate substrate that can be used, for example, with the package of FIG. 1.
Figure 3:
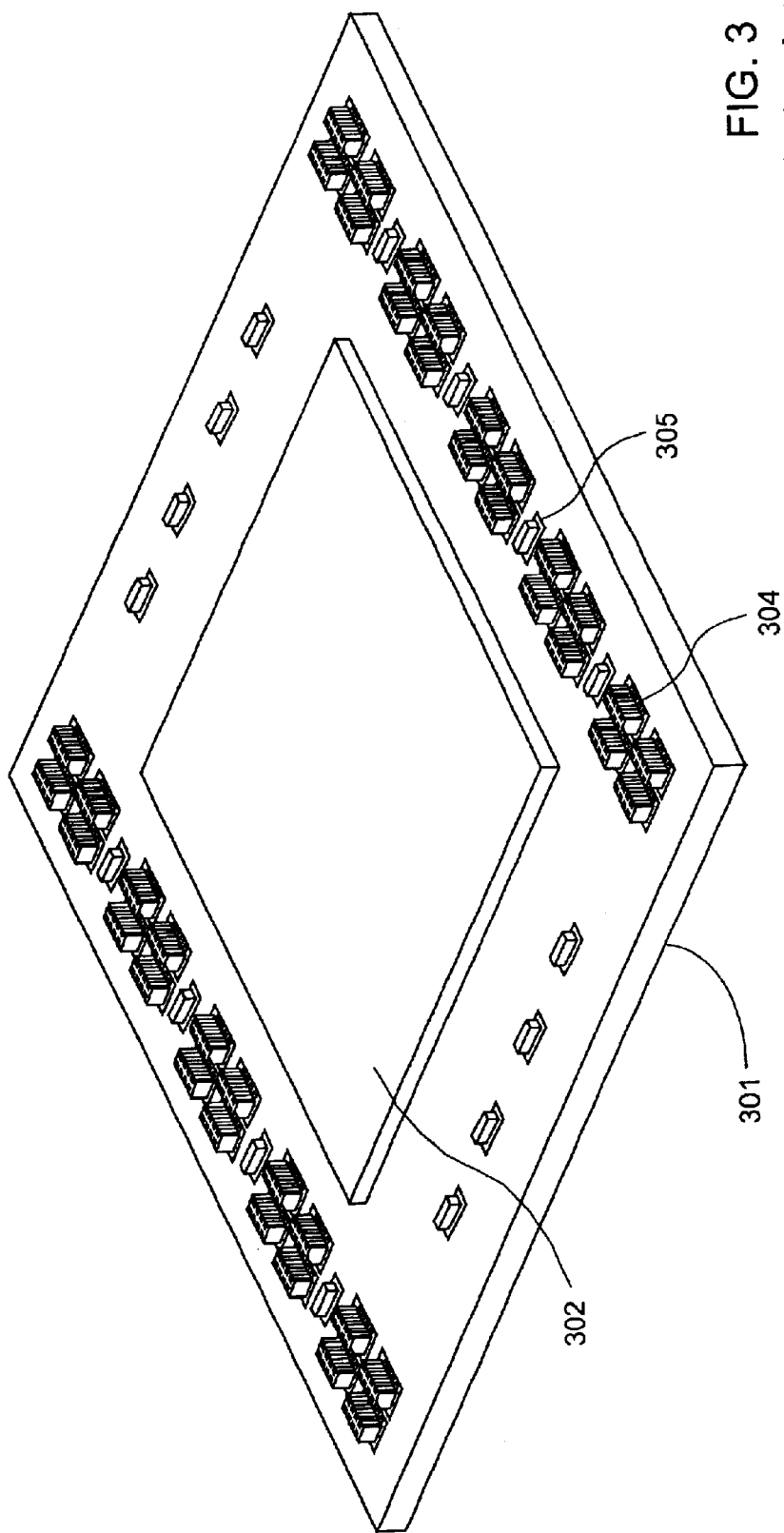
FIG. 3 shows a prior art IC package in which no lid is used.

The IC package shown in FIG. 4 overcomes the problems caused by having an exposed die as in FIG. 2, and still allows access to the capacitors 404, 405 after the package is assembled. However, the IC package of FIG. 4 leaves the outer region of flexible substrate 401 without the structural rigidity provided by a rigid lid (e.g., a metal lid). Therefore, compared to the packaged IC of FIG. 1, the arrangement shown in FIG. 4 is more susceptible to damage, such as warping under heat.

Figure 5:
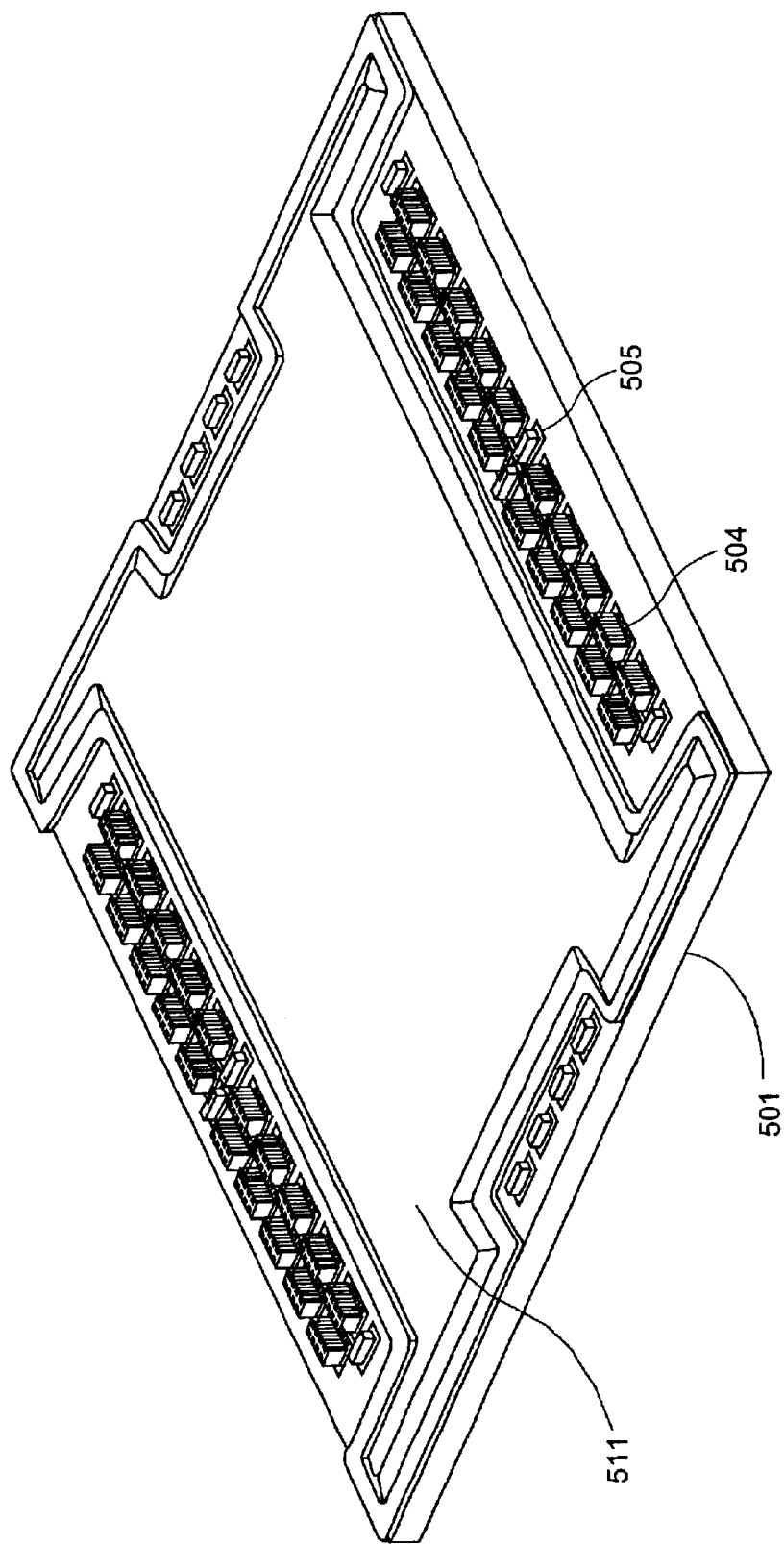
FIG. 5 shows an IC package in which a lid covers the die and extends to the corners of the laminate substrate, but leaves the capacitors exposed.

FIG. 5 illustrates another solution to the previously-described challenges. The IC package illustrated in FIG. 5 includes a lid that protects the die while leaving the capacitors exposed, but still provides the structural rigidity desirable for use with a flexible substrate.

The IC package of FIG. 5 includes a flexible substrate 501, on which are mounted capacitors 504, 505 and an IC die (not shown). Substrate 501 can be, for example, a laminate substrate, and can resemble, for example, the substrate shown in FIG. 2. Lid 511 covers the inner region of the substrate (see region 206 of FIG. 2), in which the die is mounted in a face-down position. Lid 511 can be, for example, a metal lid. The underside of lid 511 is preferably in contact with the upper surface (i.e., the back side) of the die. However, lid 511 leaves capacitors 504, 505 exposed, for easy access after assembly. Additionally, the packaged IC can be sold without the attached capacitors, so customers who do not need the capacitors do not have to pay for them.

In the pictured embodiment, lid 511 also has another feature that significantly improves the degree of structural rigidity provided by the lid. As previously described, openings are left in the lid that expose a portion of the outer region of the substrate. However, the exposed portion does not include any of the four corners of the substrate. Therefore, as shown in FIG. 5, each of the corners of the substrate is covered by an "arm" of the lid that prevents the corner of the substrate from warping when exposed to adverse conditions (e.g., heat).

In some embodiments, lid 511 is sealed to substrate 501 at the four outer corners. In some embodiments, the lid is sealed to the substrate at other points instead of, or in addition to, being sealed at the corners. The seal can be a hermetic seal or a non-hermetic seal. For example, in some embodiments an adhesive is used to attach the lid, providing a non-hermetic seal. A hermetic seal is designed to provide an airtight chamber in which the die is isolated from the outside air. In some applications, however, it is actually desirable to allow air to flow around the die, e.g., to cool the die in high-power applications. If a hermetic seal were required, each "arm" of the lid extending into a corner of the substrate would have to be wide enough to provide such a hermetic seal. When a non-hermetic seal is used, the "arms" can be much narrower, allowing more room for the mounting of capacitors.

The package configuration of FIG. 5 is particularly useful for laminate substrates, such as are commonly used in flip-chip packages. These packages are designed to be small in size, and the thinner they are, the more desirable they are considered. Therefore, the thin and flexible substrates used in such packages derive substantial benefit from the addition of a structurally rigid metal lid such as those described herein. However, it will be apparent to one skilled in the art after reading this specification that the present invention can also be applied to other flexible substrates and other structurally rigid lids. Accordingly, all such modifications and additions are deemed to be within the scope of invention, which is to be limited only by the appended claims and their equivalents.

What is claimed is:

1. A packaged integrated circuit (IC), comprising:
   a flexible substrate comprising:
      an inner region,
      an outer region,
      a plurality of inner lands disposed in the inner region,
      a plurality of outer lands disposed in the outer region, and
      a plurality of traces each coupled between an inner land and an outer land;
   an IC die having an active surface and an upper surface, the IC die being mounted in the inner region of the flexible substrate with the active surface facing the flexible substrate, the IC die having pads in electrical contact with the inner lands; and
   a structurally rigid lid disposed in contact with the upper surface of the IC die and sealed to the flexible substrate, the structurally rigid lid having openings therein exposing only a portion of the outer region of the flexible substrate.

2. The packaged IC of claim 1, further comprising:
   a plurality of capacitors mounted to the flexible substrate within the openings in the structurally rigid lid, each capacitor having a plurality of terminals in electrical contact with a plurality of the outer lands.

3. The packaged IC of claim 1, wherein the structurally rigid lid comprises a metal lid.

4. The packaged IC of claim 3, wherein the flexible substrate comprises a laminate substrate.

5. The packaged IC of claim 1, wherein the flexible substrate comprises a laminate substrate.

6. The packaged IC of claim 1, wherein the structurally rigid lid is sealed to the flexible substrate using a non-hermetic seal.

7. The packaged IC of claim 1, wherein:
   the outer region of the flexible substrate has outer corners at a plurality of points furthest from a center point of the flexible substrate; and
   the structurally rigid lid has outer corners corresponding to the outer corners of the outer region of the flexible substrate.

8. The packaged IC of claim 7, wherein the outer corners of the structurally rigid lid are sealed to the outer corners of the outer region of the flexible substrate.

9. The packaged IC of claim 8, wherein the outer corners of the structurally rigid lid are sealed to the outer corners of the outer region of the flexible substrate using a non-hermetic seal.

10. A packaged integrated circuit (IC), comprising:
a laminate substrate comprising an inner region and an outer region;
an IC die having an active surface and an upper surface, the IC die being mounted in the inner region of the laminate substrate with the active surface facing the laminate substrate; and
a metal lid disposed in contact with the upper surface of the IC die, the metal lid having openings therein exposing only a portion of the outer region of the laminate substrate.

11. The packaged IC of claim 10, further comprising:
a plurality of capacitors mounted to the laminate substrate within the openings in the metal lid.

12. The packaged IC of claim 10, wherein:
the outer region of the laminate substrate comprises outer corners at a plurality of points furthest from a center point of the laminate substrate; and
the metal lid has outer corners corresponding to the outer corners of the outer region of the laminate substrate, wherein the metal lid adds structural rigidity to the laminate substrate.

13. The packaged IC of claim 12, wherein the metal lid is sealed to the laminate substrate using a non-hermetic seal.

14. The packaged IC of claim 12, wherein the outer corners of the metal lid are sealed to the outer corners of the outer region of the laminate substrate.

15. The packaged IC of claim 14, wherein the outer corners of the metal lid are sealed to the outer corners of the outer region of the laminate substrate using a non-hermetic seal.

16. A packaged integrated circuit (IC), comprising:
a flexible rectangular substrate comprising four edges, four corners located between adjacent ones of the edges, an outer region touching each of the four corners, and a rectangular inner region encompassed by the outer region;
an IC die having an active surface and an upper surface, the IC die being mounted in the inner region of the substrate with the active surface facing the substrate; and
a structurally rigid lid disposed in contact with the upper surface of the IC die, the lid having four corners corresponding to the four corners of the substrate, and further having openings therein exposing only a portion of the outer region of the substrate, the exposed portion not including any of the four corners of the substrate,
wherein the four corners of the structurally rigid lid are sealed to the four corners of the substrate, the lid providing structural rigidity to the four corners of the substrate.

17. The packaged IC of claim 16, wherein the flexible rectangular substrate comprises a laminate substrate.

18. The packaged IC of claim 17, wherein the structurally rigid lid comprises a metal lid.

19. The packaged IC of claim 16, wherein the structurally rigid lid comprises a metal lid.

20. The packaged IC of claim 16, further comprising:
a plurality of capacitors mounted to the flexible rectangular substrate within the openings in the structurally rigid lid.

21. The packaged IC of claim 16, wherein the four corners of the structurally rigid lid are sealed to the four corners of the flexible substrate using a non-hermetic seal.

22. The packaged IC of claim 16, wherein the exposed portion of the substrate includes portions of each of the four edges of the substrate.

23. The packaged IC of claim 16, wherein the rectangular substrate is a square substrate.

24. A package for accommodating both capacitors and an integrated circuit (IC) die, the package comprising:
a flexible substrate comprising:
an inner region,
an outer region,
a plurality of inner lands disposed in the inner region, the inner lands being adapted for coupling to the IC die,
a plurality of outer lands disposed in the outer region, the outer lands being adapted for coupling to the capacitors, and
a plurality of traces each coupled between an inner land and an outer land; and
a structurally rigid lid configured to be disposed in contact with the upper surface of the IC die after mounting the IC die in the package, the structurally rigid lid having openings therein exposing only a portion of the outer region of the flexible substrate.

25. The package of claim 24, further comprising:
an IC die having an active surface and an upper surface, the IC die being mounted in the inner region of the flexible substrate with the active surface facing the flexible substrate, the IC die having pads in electrical contact with the inner lands.

26. The package of claim 25, further comprising:
a plurality of capacitors mounted to the flexible substrate within the openings in the structurally rigid lid, each capacitor having a plurality of terminals in electrical contact with a plurality of the outer lands.

27. The package of claim 24, further comprising:
a plurality of capacitors mounted to the flexible substrate within the openings in the structurally rigid lid, each capacitor having a plurality of terminals in electrical contact with a plurality of the outer lands.

28. The package of claim 24, wherein the structurally rigid lid comprises a metal lid.

29. The package of claim 28, wherein the flexible substrate comprises a laminate substrate.

30. The package of claim 24, wherein the flexible substrate comprises a laminate substrate.

31. The package of claim 24, wherein the structurally rigid lid is configured to be sealed to the flexible substrate using a non-hermetic seal.

32. The package of claim 24, wherein:
the outer region of the flexible substrate has outer corners at a plurality of points furthest from a center point of the flexible substrate; and
the structurally rigid lid has outer corners corresponding to the outer corners of the outer region of the flexible substrate for sealing thereto.

33. A package for accommodating both capacitors and an integrated circuit (IC) die, the package comprising:
a flexible rectangular substrate comprising four edges, four corners located between adjacent ones of the edges, an outer region touching each of the four corners, and a rectangular inner region encompassed by the outer region, the inner region comprising a plurality of inner lands adapted for coupling to the IC die, and the outer region comprising a plurality of outer lands adapted for coupling to the capacitors; and
a structurally rigid lid configured to be disposed in contact with the upper surface of the IC die after mounting the IC die in the package, the lid having four corners corresponding to the four corners of the substrate, and further having openings therein exposing only a portion of the outer region of the substrate, the exposed portion not including any of the four corners of the substrate, wherein the four corners of the structurally rigid lid are configured to be sealed to the four corners of the substrate, the lid providing structural rigidity to the four corners of the substrate.

34. The package of claim 33, further comprising:

an IC die having an active surface and an upper surface, the IC die being mounted in the inner region of the substrate with the active surface facing the substrate, the IC die having pads in electrical contact with the inner lands.

35. The package of claim 34, further comprising:

a plurality of capacitors mounted to the flexible substrate within the openings in the structurally rigid lid, each capacitor having a plurality of terminals in electrical contact with a plurality of the outer lands.

36. The package of claim 33, further comprising:

a plurality of capacitors mounted to the flexible substrate within the openings in the structurally rigid lid, each capacitor having a plurality of terminals in electrical contact with a plurality of the outer lands.

37. The package of claim 33, wherein the flexible rectangular substrate comprises a laminate substrate.

38. The package of claim 37, wherein the structurally rigid lid comprises a metal lid.

39. The package of claim 33, wherein the structurally rigid lid comprises a metal lid.

40. The package of claim 33, wherein the four corners of the structurally rigid lid are configured to be sealed to the four corners of the flexible substrate using a non-hermetic seal.

41. The package of claim 33, wherein the exposed portion of the substrate includes portions of each of the four edges of the substrate.

42. The package of claim 33, wherein the rectangular substrate is a square substrate.

* * * * *